(12) United States Patent
Kang (10) Patent No.: US 10,334,764 B2
(45) Date of Patent: Jun. 25, 2019

(54) OUTDOOR DISPLAY APPARATUS WITH A COOLING STRUCTURE

(71) Applicant: Samsung Electronics Co., Ltd., Suwon-si (KR)

(72) Inventor: Joon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/373,756

(22) Filed: Dec. 9, 2016

(65) Prior Publication Data

US 2017/0172016 A1    Jun. 15, 2017

(30) Foreign Application Priority Data

Dec. 10, 2015 (KR) .................. 10-2015-0175716

(51) Int. Cl.
| | | |
|---|---|---|
| H05K 7/20 | (2006.01) | |
| H05K 5/00 | (2006.01) | |
| H05K 5/02 | (2006.01) | |
| G09F 9/33 | (2006.01) | |
| G09F 9/35 | (2006.01) | |

(52) U.S. Cl.
CPC .......... *H05K 7/20972* (2013.01); *G09F 9/33* (2013.01); *G09F 9/35* (2013.01); *H05K 5/0017* (2013.01); *H05K 5/0213* (2013.01); *H05K 7/20209* (2013.01); *H05K 7/202* (2013.01); *H05K 7/20145* (2013.01)

(58) Field of Classification Search
CPC .......... H05K 7/20972; H05K 7/20145; H05K 7/202; F21V 26/00–85

USPC .............. 361/679.49–679.51, 696; 454/184; 312/236; 362/373, 218, 269, 294; 349/161

See application file for complete search history.

(56) References Cited

U.S. PATENT DOCUMENTS

| | | | |
|---|---|---|---|
| 8,351,014 B2* | 1/2013 | Dunn ..................... | F21V 29/67 349/161 |
| 8,654,302 B2* | 2/2014 | Dunn ................ | G02F 1/133385 165/104.34 |
| 2014/0334100 A1* | 11/2014 | Yoon .................. | H05K 7/20145 361/692 |

(Continued)

FOREIGN PATENT DOCUMENTS

| | | |
|---|---|---|
| JP | 9-307257 | 11/1997 |
| JP | 2010-164884 | 7/2010 |
| KR | 10-2009-0109701 | 10/2009 |

(Continued)

*Primary Examiner* — Zachary Pape
(74) *Attorney, Agent, or Firm* — Staas & Halsey LLP (57) ABSTRACT

An outdoor display apparatus more particularly, to an outdoor display apparatus having a cooling structure. An outdoor display apparatus comprising: a case provided with an inlet and an outlet; a display module disposed inside of the case and provided with a display panel on which an image is displayed; and a heat exchanger configured to perform a heat-exchange by receiving heat from the display module; wherein the heat exchanger comprises a first cooling flow path configured to circulate air around the display module in a first direction; and a second cooling flow path configured to allow air to be introduced from the outside, to perform a heat-exchange with the air in the first cooling flow path, and to be discharged in a second direction.

14 Claims, 11 Drawing Sheets

(56) References Cited

U.S. PATENT DOCUMENTS

2015/0009627 A1* 1/2015 Dunn ................ G02F 1/133382
                                                            361/697

FOREIGN PATENT DOCUMENTS

| KR | 10-2009-0116368 | 11/2009 |
| KR | 10-2010-0068675 | 6/2010 |
| KR | 10-2011-0119357 | 11/2011 |

* cited by examiner

OUTDOOR DISPLAY APPARATUS WITH A COOLING STRUCTURE

CROSS-REFERENCE TO RELATED APPLICATIONS

This application claims the benefit of Korean Patent Application No. 10-2015-0175716, filed on Dec. 10, 2015 in the Korean Intellectual Property Office, the disclosure of which is incorporated herein by reference.

BACKGROUND

1. Field

Embodiments of the present disclosure relate to an outdoor display apparatus more particularly, to an outdoor display apparatus having a cooling structure.

2. Description of the Related Art

A display apparatus is a type of apparatus configured to display an image on a screen, e.g. television, computer monitor, and digital information display. Recently, installing the display apparatus in the outdoor or the outside has been increased on the purpose of advertisement. The display apparatus may include an outdoor advertising board installed in the outside of the building to display an image.

As for the outdoor display apparatus, there may be some difficulty of the degradation caused by the increase of the surface temperature of the panel when the display panel is directly exposed to the sunlight.

The display apparatus includes a display panel (hereinafter refer to "liquid crystal panel"), and a backlight unit to allow a light to be incident to a rear surface of the liquid crystal panel. The liquid crystal panel is formed by a pair of substrates, which are disposed to face with each other with respect to a liquid crystal layer. In the backlight unit, a light source is provided to allow a light to be incident to the liquid crystal panel, and Cold cathode Fluorescent Lamp (CCFL) and Light Emitting Diode (LED) are used as the light source. The light source of the backlight unit may degrade the liquid crystal since the light source emits a heat as well as a light.

Therefore, the display apparatus is provided with a cooling device to discharge a heat generated in the light source of the backlight unit. The cooling device is configured by including a fan and an air filter. The cooling device is provided to form a cooling flow path cooling a front surface of the liquid crystal panel while suctioning an external air by using the fan, and to absorb and discharge the sunlight heat and the heat of the liquid crystal panel through the cooling flow path.

As for a heat sink provided with a fan and an air filter, the air filter is required to be periodically replaced, and it leads to generate the maintenance cost.

Further, since the fan and the air filter are needed to be disposed in the inside of the display apparatus, there is a problem that the display apparatus has a thickness as much as a thickness of the fan and the air filter.

SUMMARY

Additional aspects and/or advantages will be set forth in part in the description which follows and, in part, will be apparent from the description, or may be learned by practice of the invention.

Therefore, it is an aspect of the present disclosure to provide an outdoor display apparatus capable of improving a cooling efficiency by having a cooling structure.

It is another aspect of the present disclosure to provide a safe outdoor display apparatus configured to be closed from an external environment through a closed cooling structure configured to prevent an external air from being introduced.

It is another aspect of the present disclosure to provide an outdoor display apparatus capable of reducing the maintenance cost since an air filter is not needed.

It is another aspect of the present disclosure to provide an outdoor display apparatus capable of improving the aesthetics by achieving a thin appearance.

Additional aspects of the disclosure will be set forth in part in the description which follows and, in part, will be obvious from the description, or may be learned by practice of the disclosure.

In accordance with an aspect of the present invention, an outdoor display apparatus comprising: a case provided with an inlet and an outlet; a display module disposed inside of the case and provided with a display panel on which an image is displayed; and a heat exchanger configured to perform a heat-exchange by receiving heat from the display module; wherein the heat exchanger comprises a first cooling flow path configured to circulate air around the display module in a first direction; and a second cooling flow path configured to allow air to be introduced from the outside, to perform a heat-exchange with the air in the first cooling flow path, and to be discharged in a second direction.

Also, the first cooling flow path comprises a plurality of first flow paths formed by a part of a plurality of cooling channels, and the second cooling flow path comprises a plurality of second flow paths formed by the other of the plurality of cooling channels, wherein air in the first flow path and air in the second flow path are counter-flowed.

Also, the second flow path is configured to allow air introduced via the inlet to be heat-exchanged and then to be discharged via the outlet.

Also, the plurality of cooling channels is arranged to be alternately stacked.

Also, the plurality of cooling channels comprises a flow path forming member configured to form any one of the first flow path and the second flow path between the cooling channels.

Also, at least one part of the first flow path is formed inside of the cooling channel, and the other part of the first flow path is formed outside of the cooling channel.

Also, at least one part of the second flow path is formed inside of the cooling channel, and the other part of the second flow path is formed outside of the cooling channel.

Also, the case comprises a partition disposed between the first cooling flow path and the second cooling flow path.

Also, the first cooling flow path is formed as a closed space.

Also, the first cooling flow path comprises a first blowing device provided inside of the case to circulate air around the display module.

Also, the second cooling flow path comprises a second blowing device provided inside of the case to allow air introduced via the inlet to pass through at least one part of the heat exchanger and to be discharged via the outlet.

Also, at least one control unit is configured to control an operation of the display module, wherein the control unit is disposed on the first cooling flow path.

Also, the plurality of cooling channels comprises an air inlet and an air outlet to form the plurality of the first flow paths and the plurality of the second flow paths.

Also, a flow path controller configured to control a flow of air in the first cooling flow path, wherein the flow path controller is disposed on the air outlet of the cooling channel forming the first flow path among the plurality of cooling channels.

Also, the air inlet of the cooling channel forming the second flow path, among the plurality of cooling channels, is connected the inlet, and the air outlet of the cooling channel forming the second flow path, among the plurality of cooling channels, is connected the outlet.

Also, the air inlet comprises an extension extended by processing an end portion of the cooling channel.

Also, the outdoor display apparatus further comprising: a temperature sensor disposed in the inlet.

In accordance with another aspect of the present disclosure, a case provided with an inlet and an outlet configured to discharge air introduced via the inlet; a display module configured to display an image viewed via at least part of the case; and a heat exchanger configured to perform a heat-exchange by receiving heat from the display module; wherein the heat exchanger comprises a first cooling flow path disposed inside of the case and provided with a plurality of first flow paths configured to circulate air around the display module by a part of a plurality of cooling channels; and a second cooling flow path provided with a second flow path formed by the other of the plurality of cooling channels and configured to allow air to flow in a direction opposite to the air in the first flow path.

Also, the first cooling flow path is disposed to receive heat from the display module and formed as a closed space so that air is circulated to the display module.

Also, the second cooling flow path is formed to allow air introduced via the inlet to be heat exchanged through the second flow path and to be discharged via the outlet.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Reference will now be made in detail to the embodiments, examples of which are illustrated in the accompanying drawings, wherein like reference numerals refer to the like elements throughout. The embodiments are described below to explain the present invention by referring to the figures.

Hereinafter embodiments of the present disclosure will be described with reference to drawings. In the following detailed description, the terms of "front end", "rear end", "upper portion", "lower portion", "upper end", "lower end" and the like may be defined by the drawings, but the shape and the location of the component is not limited by the term.

Figure 1:
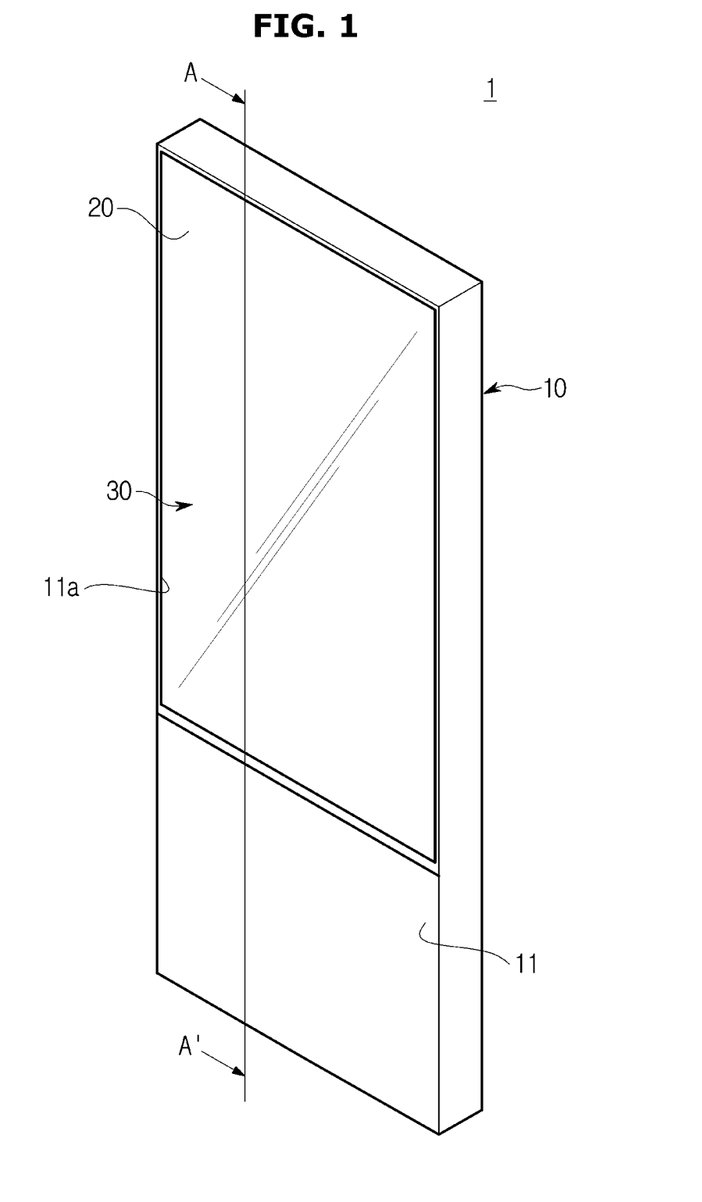
FIG. 1 is a perspective view illustrating a display device according to an embodiment of the present invention.
Figure 2:
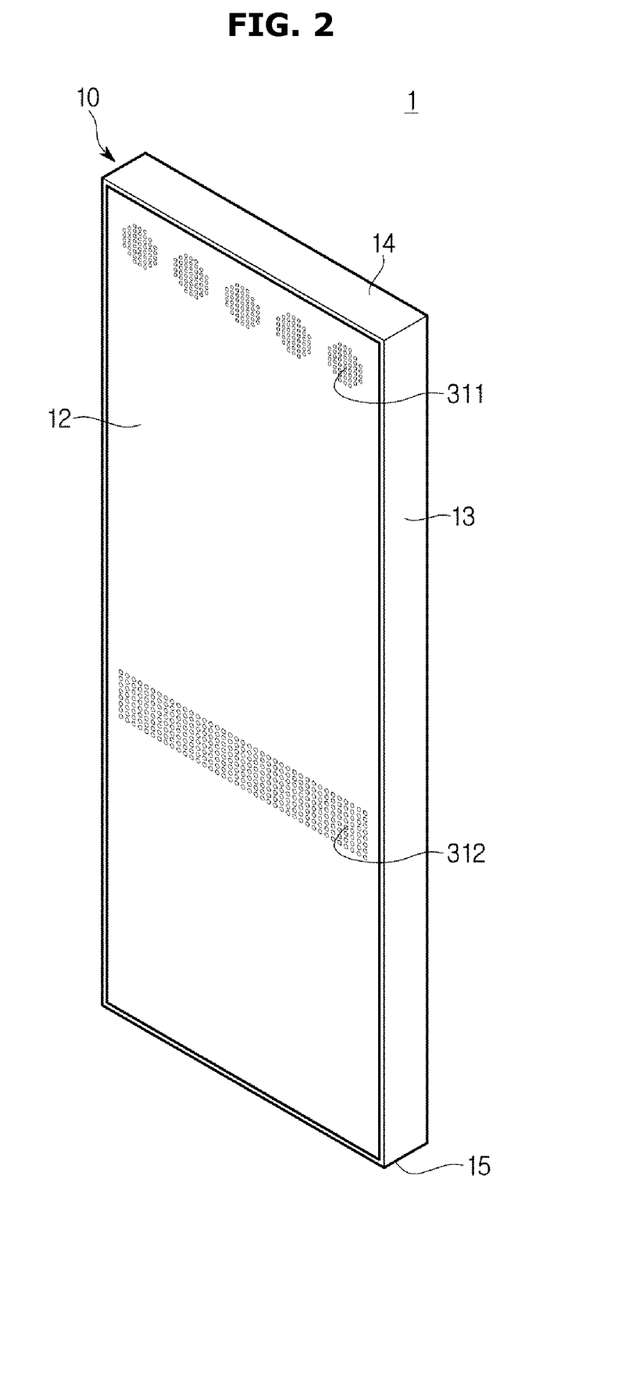
FIG. 2 is a rear perspective view illustrating a display device according to an embodiment of the present invention.

FIGS. 1 and 2 are views illustrating an outdoor display apparatus in accordance with one embodiment of the present disclosure.

As illustrated in FIGS. 1 and 2, an outdoor display apparatus 1 may include a case 10 forming an exterior and in which an opening 11a is provided in a front surface thereof; a glass 20 provided in the opening 11a of the case 10; and a display module 30 installed inside of the case 10 to display an image viewed through the opening 11a.

The case 10 may be configured to be installed in the outdoor. The case 10 may include a front surface 11; a rear surface 12; and a plurality of lateral surfaces 13 connecting the front surface 11 and the rear surface 12. The lateral surfaces 13 may include an upper surface 14; a lower surface 15; and a left lateral surface and a right lateral surface.

The opening 11a may be formed in at least one part of the front surface 11. According to one embodiment, a case in which the opening 11a is disposed on an upper side of the front surface 11, the glass 20 is provided in the opening 11a, and the glass 20 is provided in at least one part of the front surface 11 has been described as an example, but is not limited thereto. For example, an entire front surface is opened and thus the entire front surface may be formed of glass.

Meanwhile, the glass 20 provided in the opening 11a of the front surface 11 may be formed of a transparent material including a transparent member having a sufficient intensity, e.g. a tempered glass.

On an inner side of the glass 20, a film 21 may be provided to block a reflected light caused by an outdoor daylight. The film 21 may include a polarizing film.

The glass 20 may be formed to have a size corresponding to the display module 30 provided inside of the case 10 to allow an image displayed on the display module 30 installed inside of the case 10 to be viewed from the outside.

An inlet 311 may be formed on the rear surface 12 of the case 10 so that air in the outside (hereinafter refer to as "external air") is introduced into the inside of the case 10. The inlet 311 may be provided in plural. A plurality of the inlets 311 may be apart from each other with a certain distance on an upper end portion of the rear surface 12. According to one embodiment, a case in which five inlets 311 are provided has been described as an example, but is not limited thereto. For example, the inlet may include a slit that is elongated in a horizontal direction on an upper portion of the rear surface. The size and the number of the inlet may vary according to the size or the shape of the display apparatus. Also, a temperature sensor (not shown) disposed in the inlet (311).

Further, an outlet 312 may be formed on the rear surface 12 of the case 10 so that external air introduced into the inside of the case 10 is discharged to the outside. The outlet 312 may be provided in plural. A plurality of the outlets 312 may be disposed on the middle portion of the rear surface 12. According to one embodiment, a case in which the outlet 312 is formed such that a plurality of certain size holes is disposed on the middle portion of the rear surface to have a certain distance, has been described as an example, but is not limited thereto. The size and the opening of the outlet 312 may vary according to the size or the shape of the display apparatus.

Meanwhile, the display module 30 may be installed inside of the case 10. The display module 30 may include a display panel 31 configured to display an image described later; and a backlight unit (not shown) provided in the rear side of the display panel 31 to emit a light to the display panel 31.

In addition, the outdoor display apparatus 1 may include a control unit 40 including at least one circuit board (not shown) configured to drive the display module 30 by applying a signal to the display panel 31. A variety of control means, e.g. Central processing unit (CPU) and symmetric multiprocessing (SMP), configured to perform functions and to send and receive information may be mounted to the control unit 40, and the control means may generate a heat as a heating element.

The control unit 40 may be disposed on a lower side of the display module 30. According to one embodiment of the present disclosure, a case in which the control unit 40 is disposed on a lower side of the display module 30 has been described as an example, but is not limited thereto. For example, the control unit may be disposed on the rear side of the display module.

The outdoor display apparatus 1 may be degraded by a heat generated in the inside by the control mean, and a heat generated by the sunlight from the outside.

Figure 3:
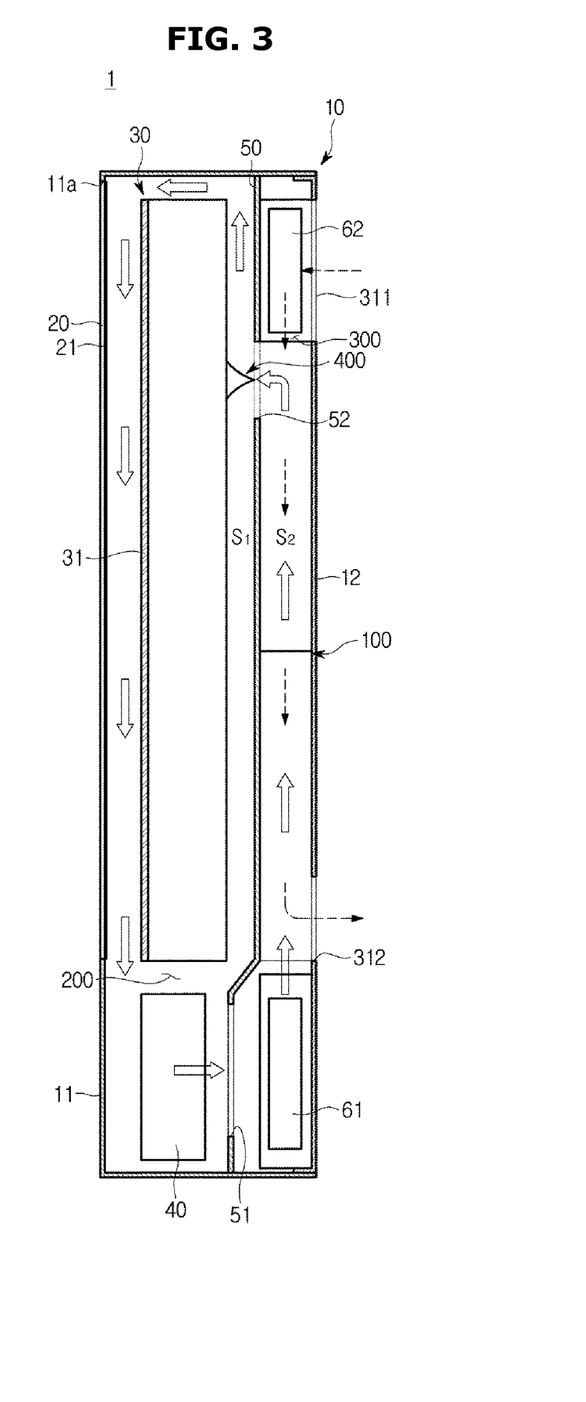
FIG. 3 is a cross-sectional view taken along line A-A' of FIG. 1, particularly a schematic view illustrating a flow path of the display apparatus in accordance with one embodiment of the present disclosure.
Figure 4:
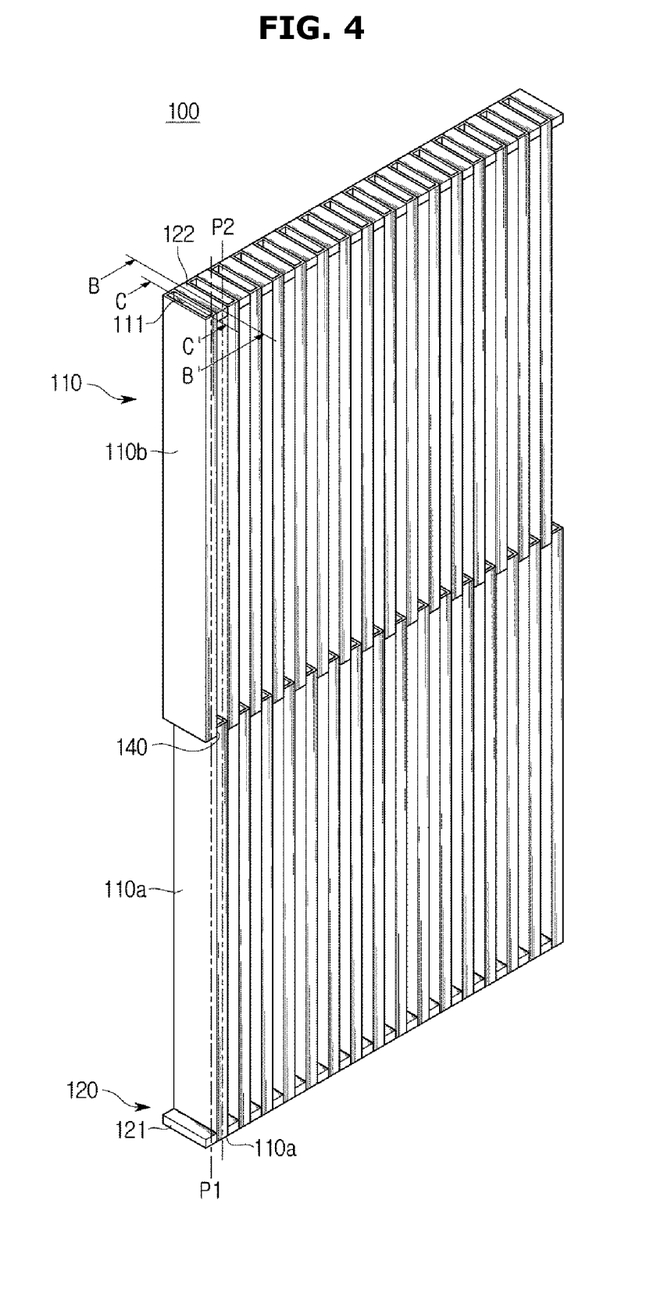
FIG. 4 is a perspective view illustrating a cooling device of the display apparatus in accordance with one embodiment of the present disclosure.
Figure 5:
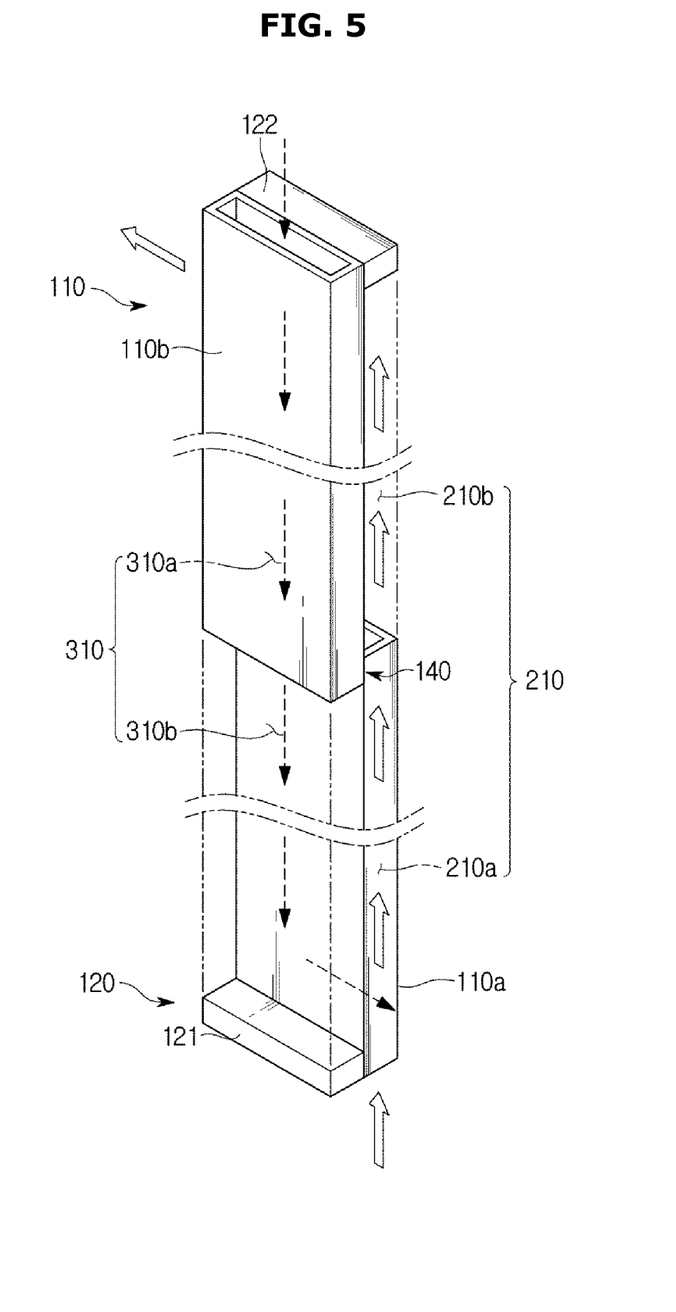
FIG. 5 is a view illustrating a first cooling flow path and a second cooling flow path of the cooling device in accordance with one embodiment of the present disclosure.
Figure 6:
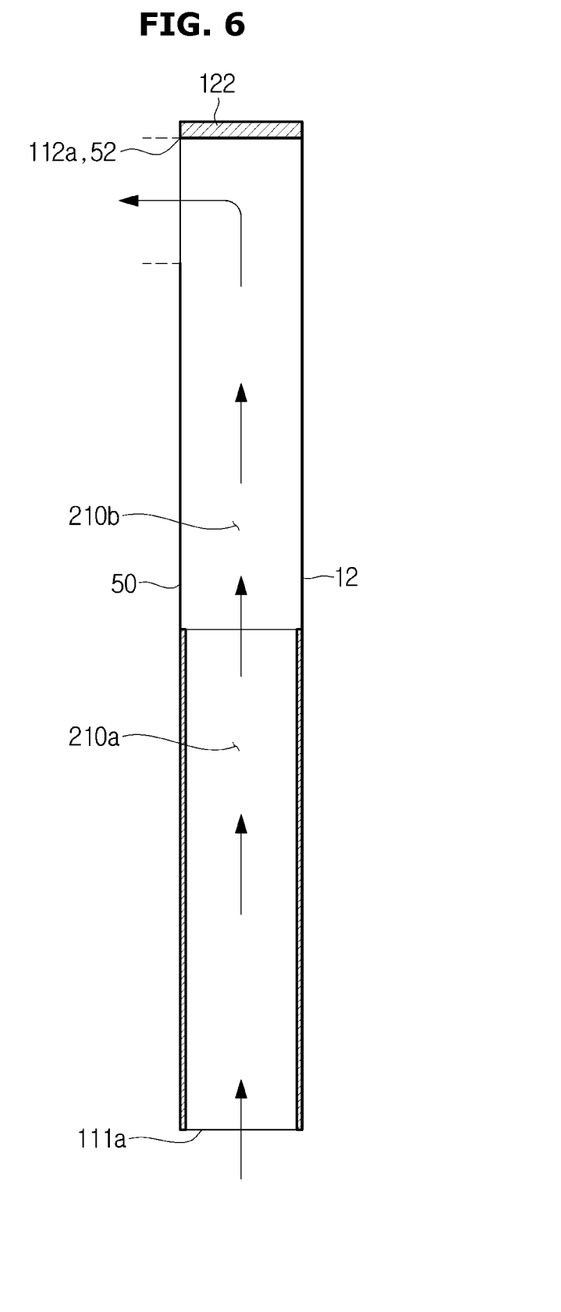
FIG. 6 is a schematic cross-sectional view taken along B-B' of FIG. 4, particularly a view illustrating the first cooling flow path of the cooling device in accordance with one embodiment of the present disclosure.
Figure 7:
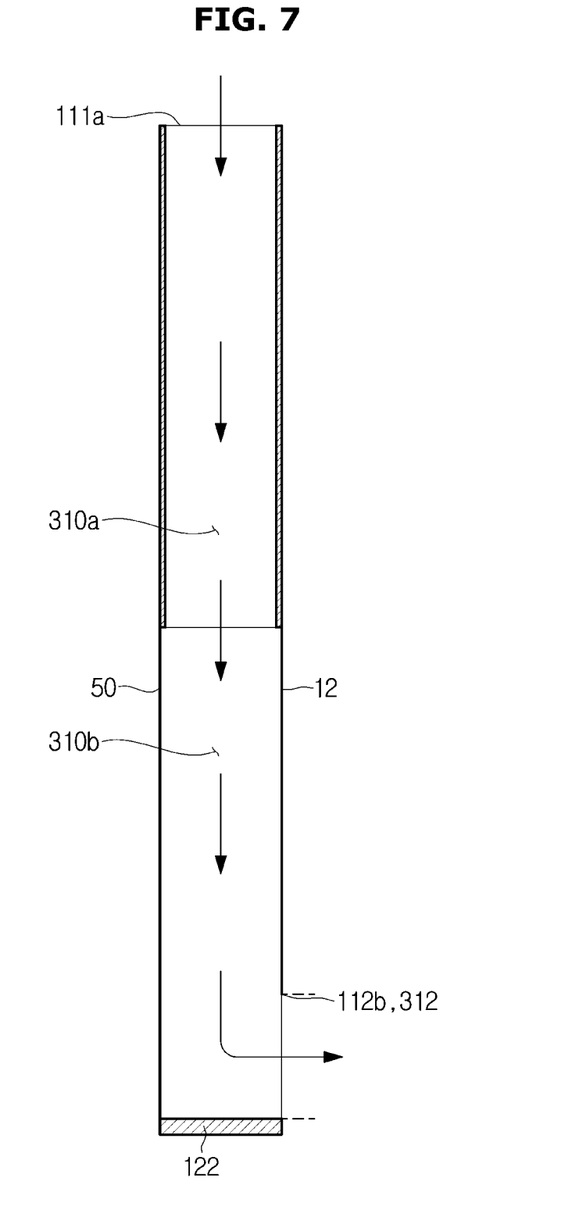
FIG. 7 is a schematic cross-sectional view taken along C-C' of FIG. 4, particularly a view illustrating the second cooling flow path of the cooling device in accordance with one embodiment of the present disclosure.

Therefore, a heat exchanger 100 may be provided inside of the case 10 to maintain an internal temperature of the case 10 within a certain range FIG. 3 is a cross-sectional view taken along line A-A' of FIG. 1, particularly a schematic view illustrating a flow path of the display apparatus in accordance with one embodiment of the present disclosure, FIG. 4 is a perspective view illustrating a cooling device of the display apparatus in accordance with one embodiment of the present disclosure, FIG. 5 is a view illustrating a first cooling flow path and a second cooling flow path of the cooling device in accordance with one embodiment of the present disclosure, FIG. 6 is a schematic cross-sectional view taken along B-B' of FIG. 4, particularly a view illustrating the first cooling flow path of the cooling device in accordance with one embodiment of the present disclosure, and FIG. 7 is a schematic cross-sectional view taken along C-C' of FIG. 4, particularly a view illustrating the second cooling flow path of the cooling device in accordance with one embodiment of the present disclosure.

As illustrated in FIGS. 3 to 7, the heat exchanger 100 installed inside of the outdoor display apparatus 1 for the heat exchange may include a plurality of cooling channels 110.

The heat exchanger 100 may be disposed in the rear side of the display module 30. The heat exchanger 100 may be disposed in the more rear side than a partition 50 configured to divide an inner space of the case 10.

The partition 50 may divide the inner space of the case 10 into a front portion and a rear portion. The partition 50 may divide the inner space of the case 10 into a front region (S1) in which the display module 30 is disposed and a rear region (S2) in which the heat exchanger 100 is disposed. The partition 50 may be disposed on the center of the inner space of the case 10, and may be formed in a board shape.

A first cooling flow path hole 51 and a first flow path hole 52 may be formed in a lower portion and an upper portion of the partition 50, respectively, so as to form a first cooling flow path 200. The first cooling flow path hole 51 may be formed in the lower portion of the partition 50 and the first flow path hole 52 may be formed in the upper portion of the partition 50. In this time, the first flow path hole 52 may correspond to an air outlet 112a of a first flow path 210 formed in the plurality of cooling channels 110. A size and a shape of the first flow path hole 52 may correspond to the air outlet 112a of the plurality of cooling channels 110 forming the first flow path 210.

In the front region (S1) of the case 10, the display module 30 and the control unit 40 configured to drive the display module 30 may be disposed.

In the rear region (S2) of the case 10, the heat exchanger 100 may be disposed. The heat exchanger 100 may include the first cooling flow path 200 and a second cooling flow path 300 formed such that the plurality of cooling channels 110 is apart from each other.

The first cooling flow path 200 may be disposed to receive a heat from the display module 30 and to circulate air around the display module 30. The first cooling flow path 200 may be formed to include the first flow path 210 formed by at least one of the plurality of cooling channels 110. The first flow path 210 may be formed in plural number.

The first cooling flow path 200 may include a first blowing device 61 to circulate air, which is heat-exchanged, around the display module 30. The first blowing device 61 may be disposed the rear region (S2) of the case 10. The first blowing device 61 may be disposed in the rear side of the first cooling flow path hole 51. The first cooling flow path 200 may be formed as a closed space.

Therefore, the air in the first cooling flow path 200 may be heat-exchanged by the first flow path 210 while moving from the front side to the rear side of the display module 30 by the first blowing device 61 and then moving to the front side again, and thus the air may cool a heat generated in the display module 30 and the display panel 31.

The second cooling flow path 300 may be formed to allow air introduced from the outside of the case 10 to be heat-exchanged and then to be discharged to the outside of the case 10. The second cooling flow path 300 may be formed to include a second flow path 310 formed by at least one of the plurality of cooling channels 110. The second flow path 310 may be formed in plural number.

The second cooling flow path 300 may include a first blowing device 61 to suction the external air into the inside of the case 10 via the inlet 311, to perform a heat exchange through the second flow path 310, and to discharge the heat-exchanged air to the outside via the outlet 312. A second blowing device 62 may be disposed on the rear region (S2) of the case 10. The second blowing device 62 may be disposed in an upper portion of the rear side of the partition 50. The second blowing device 62 may be disposed in a position corresponding to the inlet 311 of the case 10.

The first blowing device 61 and the second blowing device 62 may be configured to include a cooling fan (not shown) and a fan motor (not shown).

Meanwhile, the partition 50 may be installed to be sealed by the case 10 and a water proof technology of IP56 or IP65 that is a sealing standard.

The first cooling flow path 200 and the second cooling flow path 300 may be formed to be separated from each other. Therefore, the first flow path 210 and the second flow path 310 may be also formed to be separated from each other.

The first flow path 210 and the second flow path 310 may be alternately disposed by the plurality of cooling channels 110. The first flow path 210 and the second flow path 310 may be formed by the plurality of cooling channels 110.

The cooling channel 110 may be formed in a rectangular panel shape in which an air passage 210a and 310a are formed in the center thereof to allow air to flow. The cooling channel 110 may be formed of a metal extruded material including at least one of copper, stainless steel and aluminum.

Since the cooling channel 110 in the panel shape minimizes a supporting structure for securing the rigidity, by using the metal extruded material, the size of the air passage 210a and 310a for the flow of the air may be increased and thus the flow resistance may be reduced.

The cooling channel 110 may be disposed such that a plurality thereof is apart from each other with a certain distance. The cooling channel 110 may be disposed such that the plurality thereof is stacked one on top of another. The cooling channel 110 may be vertically disposed in the rear region (S2) of the case 10 so that air flows from an upper side to a lower side or from a lower side to an upper side.

The plurality of the cooling channels 110 may be provided to be vertically stacked, and arranged in an alternate manner. The plurality of the cooling channels 110 may be provided to be alternately stacked.

A flow path forming member 120 may be provided between the plurality of the cooling channels 110 to form any one of the first flow path 210 and the second flow path 310. The flow path forming member 120 may have a thickness identical to a thickness of the cooling channel 110. The flow path forming member 120 may be disposed in an end portion corresponding to the plurality of the cooling channels 110.

Particularly, the first flow path 210 of the first cooling flow path 200 will be described in followings with reference to FIGS. 4 to 6.

A plurality of cooling channels 110a forming the first flow path 210 may be formed such that the cooling channel 110 is disposed in the lower portion of the rear region (S2) of the case 10 and the flow path forming member 120 is disposed in the upper portion corresponding to the cooling channel 110.

The flow path forming member 120 may include a second flow path forming member 122 forming the first flow path 210 and a first flow path forming member 121 forming the second flow path 310.

The plurality of cooling channels 110a forming the first flow path 210 may be disposed in parallel with each other with a certain distance. In this time, the certain distance between the plurality of cooling channels 110a may be identical to the distance of a plurality of cooling channels 110b forming the second flow path 310.

The plurality of cooling channels 110a forming the first flow path 210 may be disposed in the lower portion of the rear region (S2) of the case 10. The second flow path forming member 122 may be disposed on an end portion of a vertical collinear line (P2) of the plurality of cooling channels 110a.

The plurality of cooling channels 110a forming the first flow path 210 may include a first flow path air inlet 111a to allow air flowing the first flow path 210 to be introduced and a first flow path air outlet 112a. The first flow path air inlet 111a may be formed in a lower end of the plurality of cooling channels 110. The first flow path air outlet 112a may be formed by the first flow path hole 52 of the partition 50 placed in a space formed between outer surfaces of the plurality of cooling channels 110 disposed in the upper portion of the case 10. The first flow path hole 52 and the first flow path air outlet 112a of the plurality of cooling channels 110a forming the first flow path 210 may be identical to each other.

Therefore, air flowing in the first flow path 210 may be introduced into the air passage 210a via the first flow path air inlet 111a in the lower end of the plurality of cooling channels 110a, and then moved to an upper direction (a first direction). The air passing through the plurality of cooling channels 110a may be heat-exchanged by passing through the air passage 210b formed by an outer surface of the plurality of cooling channels 110b in the upper side, and then may cool a heat generated by the display module 30 and the display panel 31 while being moved from the upper direction of the display module 30 to the lower direction of the front surface of the display module 30 via the first flow path hole 52 of the partition 50. In addition, the air may cool a heat generated by the control unit 40 on the first cooling flow path 200 and a heat caused by an incident heat from the outside, and then the air may be circulated by being introduced into the first flow path 210 by the first blowing device 61.

The plurality of cooling channels 110b forming the second flow path 310 may be formed such that the plurality of cooling channels 110b is disposed in parallel with each other with a certain distance in an upper portion of the rear region (S2) of the case 10. In this time, the certain distance between the plurality of cooling channels 110b may be identical to the distance of a plurality of cooling channels 110a forming the first flow path 210.

The plurality of cooling channels 110b forming the second flow path 310 may be disposed in the upper portion of the rear region (S2) of the case 10. The first flow path forming member 121 may be disposed on an end portion of a vertical collinear line (P1) of the plurality of cooling channels 110b.

The plurality of cooling channels 110a forming the first flow path 210 and the plurality of cooling channels 110b forming the second flow path 310 may include an overlap portion 140 overlapped with a certain distance in the middle portion between the plurality of cooling channels 110a forming the first flow path 210 and the plurality of cooling channels 110b forming the second flow path 310.

The plurality of cooling channels 110 may be apart from each other with a certain distance by the overlap portion 140.

Meanwhile, the plurality of cooling channels 110b forming the second flow path 310 may include a second flow path air inlet 111b to allow air flowing the second flow path 310 to be introduced and a second flow path air outlet 112b. The second flow path air inlet 111b may be formed in an upper end of the plurality of cooling channels 110b. The second flow path air outlet 112b may be formed by the outlet 312 of the rear surface 12 of the case 10 placed in a space formed between outer surfaces of the plurality of cooling channels 110a forming the first flow path 210 disposed in the lower portion of the case 10. The second flow path air outlet 112b of the second flow path 310 and the outlet 312 of the case 10 may be identical to each other.

Therefore, air flowing the second flow path 310 that is the external air introduced into the second cooling flow path 300 via the inlet 311 of the case 10 may be introduced into the air passage 310a inside of the plurality of cooling channels 110 via the second flow path air inlet 111b in the upper end of the plurality of cooling channels 110b and then moved to a lower direction (a second direction). The air passing through the plurality of cooling channels 110 may be heat-exchanged by passing through the air passage 310b formed by an outer surface of the plurality of cooling channels 110a in the lower side, and then discharged to the outside via the outlet 312 of the case 10. The air flowing the second flow path 310 may absorb internal heat of the case 10 and then be discharged to the outside of the case 10.

"First direction" may represent a direction from a lower side to an upper side of the case 10 and "second direction" may represent a direction from an upper side to a lower side of the case 10, wherein the first direction and the second direction are opposite to each other. According to one embodiment of the present disclosure, a case in which the first direction represents from the lower side to the upper side and the second direction represents from the upper side to the lower side, has be described as an example, but is not limited thereto.

Air flowing in the first direction by the first flow path 210 and air flowing in the second direction by the second flow path 310 may be heat-exchanged with each other by a counter-flow.

The heat exchanger 100 using plurality of cooling channels 110 may improve the heat exchange efficiency by using the counter-flow technology, other than a cross-flow heat exchange technology in which hot air and cold air are cross flowed and it used in a conventional heat exchanger.

The structure in which the cooling channel 110 having the panel shape is stacked and alternated while being apart from each other, may allow the thickness and weight of the product to be reduced. Further, the external air and the internal air may be separated without being mixed, and thus heat transmission may be performed to the external air by the internal air.

Figure 8:
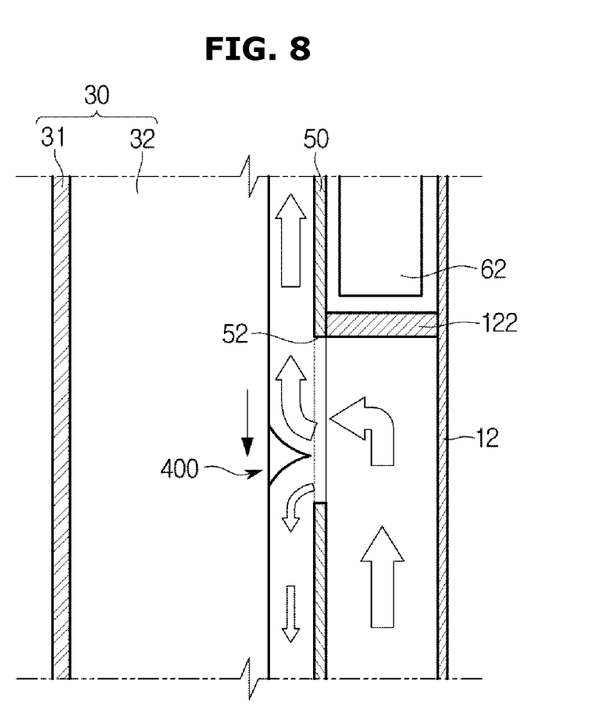
FIGS. 8 and 9 are views illustrating a flow path controller of the cooling device in accordance with one embodiment of the present disclosure.
Figure 9:
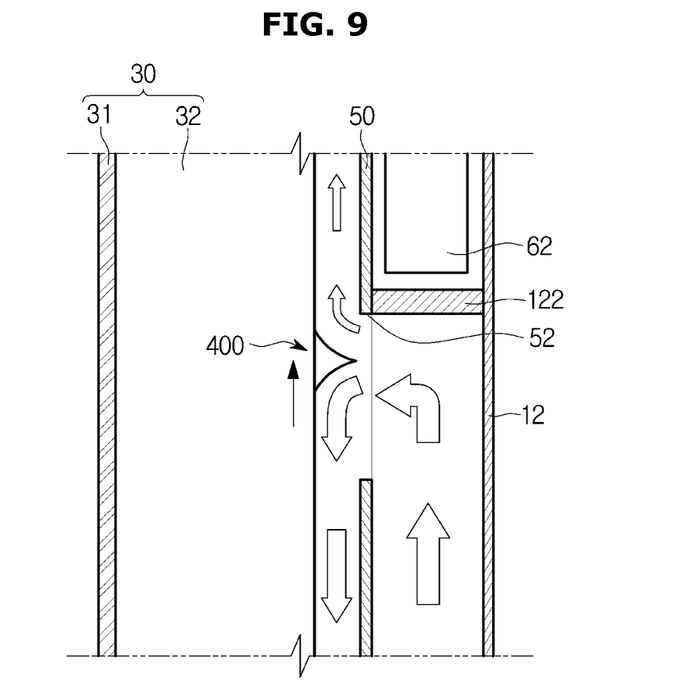

FIGS. 8 and 9 are views illustrating a flow path controller of the cooling device in accordance with one embodiment of the present disclosure.

The first cooling flow path 200 may include a flow path controller 400 to control a flow of air.

The flow path controller 400 may be installed in the first flow path air outlet 112a of the first flow path 210, i.e., the first flow path hole 52 of the partition 50.

The air in the first cooling flow path 200 may flow by the first blowing device 61. In the first cooling flow path 200, hot air may be introduced into the plurality of cooling channels 110a forming the first flow path 210 by the first blowing device 61. The hot air may be heat-exchanged by passing through the plurality of cooling channels 110a forming the first flow path 210. In this time, hot air in the first flow path 210 may be cooled by cold air in the second flow path 310.

Heat-exchanged cold air in the first flow path 210 may be divided by the flow path controller 400 installed in the first flow path air outlet 112a of the first flow path 210.

The flow path controller 400 may control the cold air in the first flow path 210 so that the cold air flows to at least one side between the front surface and the rear surface of the display module 30.

When the cold air flows to the front surface of the display module 30, the cold air may flow between the front surface of the display panel 31 and the glass 20 and then the cold air may cool the display panel 31 by absorbing the solar heat that is incident from the outside.

In this time, while flowing from the upper side to the lower side of the display panel 31, the cold air may cool a heat generated by LED (not shown) inside of the display module 30 and a heat focused on the upper side of the display panel 31 by the flow of air, and thus the cooling efficiency may be improved.

The air passing through between the front surface of the display panel 31 and the glass 20 may pass through the control unit 40 to cool the control unit 40 and then introduced into the first flow path 210 by the first blowing device 61.

Meanwhile, cold air flowing in the rear surface of the display module 30 may cool the display panel 31 and a variety of circuit boards (not shown) disposed on the rear side of the display panel 31 and then introduced into the first flow path 210 by the first blowing device 61.

The flow path controller 400 may function of dividing the cold air flowing from the first flow path 210 to the display module 30. The flow path controller 400 may control an amount of the air according to a position of the flow path controller 400. The flow path controller 400 may guide a flow of the cold air that is divided according to the position of the flow path controller 400. The flow path controller 400 may appropriately control the amount of the air according to a heat value of the display module 30 and a heat value of the front surface and the rear surface of the display panel 31. Particularly, the flow path controller 400 may be moved to the lower side so that the large amount of the cold air is moved to the upper side of the display module 30. In contrast, the flow path controller 400 may be moved to the upper side so that the large amount of the cold air is moved to the lower side of the display module 30.

The flow path controller 400 may guide the flow of the cold air discharged from the first flow path 210. That is, the flow path controller 400 may guide the divided cold air to each direction so that the resistance of the air may be reduced.

Figure 10:
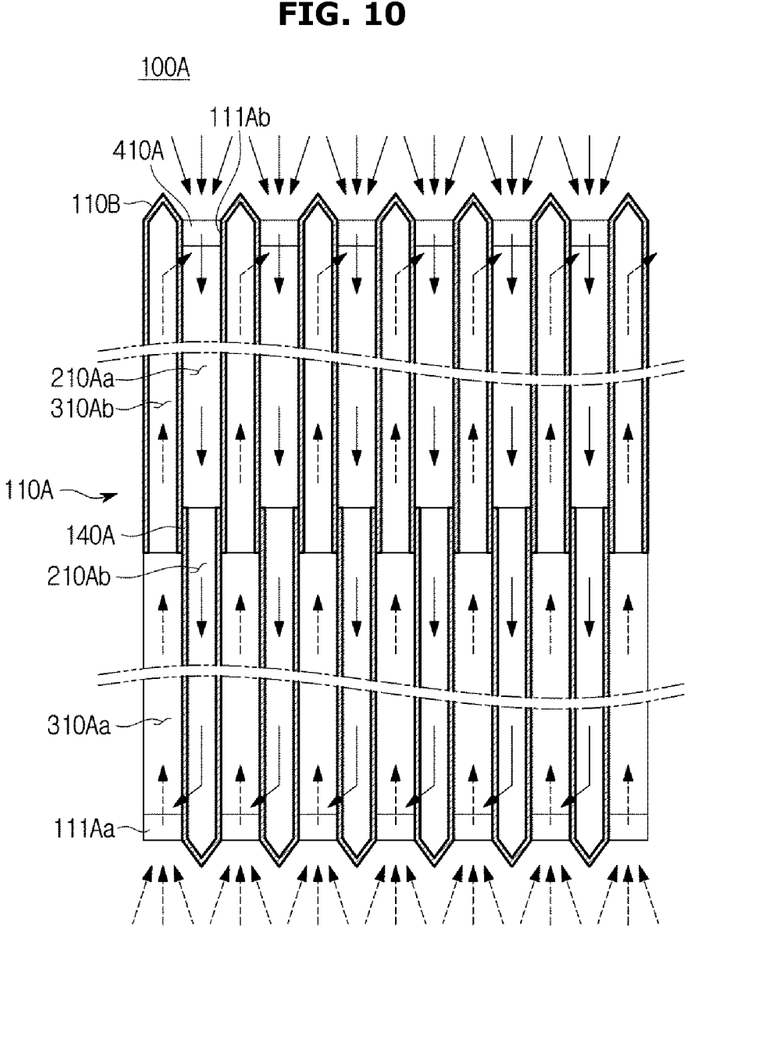
FIG. 10 is a view schematically illustrating a cooling flow path of a cooling device in accordance with another embodiment of the present disclosure.
Figure 11:
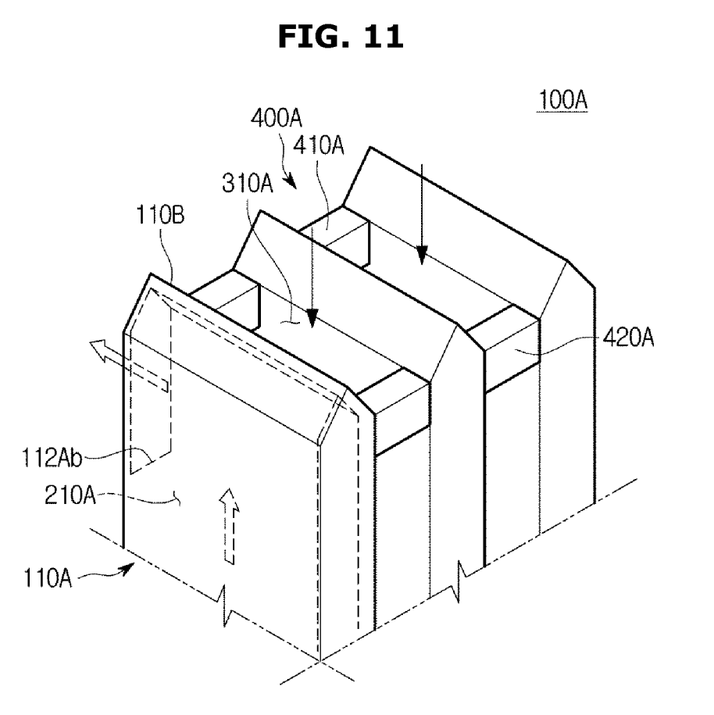
FIG. 11 is a perspective view illustrating the cooling device in accordance with another embodiment of the present disclosure. Reference numerals, which are not shown in FIGS. 10 and 11, may refer to FIGS. 1 to 9.

FIG. 10 is a view schematically illustrating a cooling flow path of a cooling device in accordance with another embodiment of the present disclosure, and FIG. 11 is a perspective view illustrating the cooling device in accordance with another embodiment of the present disclosure. Reference numerals, which are not shown in FIGS. 10 and 11, may refer to FIGS. 1 to 9.

As illustrated in FIGS. 10 to 11, as for a heat exchanger 100A, a first flow path 210A and a second flow path 310A may be formed by a plurality of cooling channels 110A.

The plurality of cooling channels 110A may be formed in a rectangular panel shape to allow air to flow in the center thereof. The cooling channel 110A may be formed of a metal extruded material including at least one of copper, stainless steel and aluminum.

Since the cooling channels 110A in the panel shape minimizes a supporting structure for securing the rigidity by using the metal extruded material, the size for the flow of the air may be increased and thus the flow resistance may be reduced.

The cooling channels 110A may be formed such that a plurality thereof is apart from each other with a certain distance. The cooling channels 110A may be disposed such that the plurality thereof is stacked one on top of another. The cooling channels 110A may be vertically disposed in a rear region (S2) of a case 10 so that air flows from an upper side to a lower side or from a lower side to an upper side.

The plurality of the cooling channels 110A may be provided to be vertically stacked, and arranged in an alternate manner. The plurality of the cooling channels 110A may be provided to be alternately stacked.

The plurality of the cooling channels 110A may extend an entrance area by processing an end portion placed in an air inlet side. The plurality of the cooling channels 110A may include an extension 110B to extend the entrance area in the end portion thereof. The extension 110B of the plurality of the cooling channels 110A may reduce an airflow resistance of air that is introduced into the cooling channels 110A.

A flow path forming member 120A, which is provided to form any one of a first flow path 210A and a second flow path 310A between the plurality of the cooling channels 110A, may include a pair of a first flow path forming member 410A and a second flow path forming member 420A, which are apart from each other to form an air inlet 111Aa and 111Ab of the first flow path 210A and the second flow path 310A.

The first flow path forming member 410A and the second flow path forming member 420A may be apart from each other with a certain distance on one side and the other side of the cooling channels 110A so that air may be introduced into the first flow path 210A and the second flow path 310 A via the separated space.

In this time, an air entrance area may be increased by the extension 110B of the cooling channels 110A formed by the first flow path forming member 410A and the second flow path forming member 420A, and thus the air resistance in the entrance of the cooling channel 110A may be significantly reduced.

An operation of the first flow path 210A of a first cooling flow path 200A and the second flow path 310A of a second cooling flow path 300A, which are formed by the plurality of the cooling channels 110A according to another embodiment may be applied to one embodiment of the present disclosure, and thus a detail description thereof will be omitted.

As is apparent from the above description, according to the proposed display apparatus, the cooling efficiency may be improved since the display apparatus having the closed cooling flow path and circulation flow path structure.

In addition, the display apparatus has a closed cooling structure to prevent the external air from being introduced thereto and isolated from the outside environment so that foreign materials, e.g. moisture or dust, are prevented from being introduced thereinto, thereby improving the stability.

Further, since the air filter is not required, the maintenance cost may be reduced and since the product becomes a thin, the aesthetics may be improved.

According to an embodiment, a method includes circulating air around a display of the outdoor display in a first direction in a first cooling flow path to exchange heat generated from the display, and introducing air to flow in a second direction in a second flow path to exchange the heat with the first air.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An outdoor display apparatus to display an image, comprising:
a case;
a display module disposed inside of the case to display the image;
a flow path controller configured to control an amount of cold air between a front surface and a rear surface of the display module;
a first cooling flow path disposed inside of the case, including a plurality of first flow paths formed by a part of a plurality of cooling channels, and configured to pass air around the display module; and
a second cooling flow path disposed inside of the case, including a plurality of second flow paths formed by a remainder of the plurality of cooling channels, and configured to introduce air from an outside, to exchange heat with the air in the first cooling flow path, and to discharge the introduced air to the outside of the apparatus;
wherein:
the plurality of cooling channels includes an air inlet and an air outlet to form the plurality of the first flow paths and the plurality of the second flow paths,
the air in the first flow path and the air in the second flow path are counter-flowed, and
the flow path controller is disposed to face the air outlet of the cooling channel forming the first flow path among the plurality of cooling channels, and configured to divide the cold air flowing from the first flow path by moving between upper side and lower side of the air outlet of the cooling channels forming the first flow path.

2. The outdoor display apparatus of claim 1, wherein the case is provided with an inlet and an outlet; and the second flow path is configured to introduce the air via the inlet and discharge the air via the outlet.

3. The outdoor display apparatus of claim 1, wherein the plurality of cooling channels are arranged to be alternately stacked.

4. The outdoor display apparatus of claim 1, wherein the plurality of cooling channels comprises a flow path forming member configured to form any one of the first flow path and the second flow path between the plurality of cooling channels.

5. The outdoor display apparatus of claim 4, wherein at least one part of the first flow path is formed inside of a cooling channel among the plurality of cooling channels, and the other part of the first flow path is formed outside of the cooling channel.

6. The outdoor display apparatus of claim 4, wherein at least one part of the second flow path is formed inside of a cooling channel among the plurality of cooling channels, and the other part of the second flow path is formed outside of the cooling channel.

7. The outdoor display apparatus of claim 1, wherein the case comprises a partition disposed between the first cooling flow path and the second cooling flow path.

8. The outdoor display apparatus of claim 1, wherein the first cooling flow path is formed as a closed space.

9. The outdoor display apparatus of claim 1, wherein the first cooling flow path comprises a first blowing device provided inside of the case to circulate air around the display module.

10. The outdoor display apparatus of claim 1, wherein the case is provided with an inlet and an outlet; and the second cooling flow path comprises a second blowing device provided inside of the case to introduce air via the inlet to pass through at least one part of the second cooling flow path and to be discharged via the outlet.

11. The outdoor display apparatus of claim 1 further comprising:

at least one control unit configured to control an operation of the display module, wherein the control unit is disposed on the first cooling flow path.

12. The outdoor display apparatus of claim 1, wherein the case is provided with an inlet and an outlet; and
the air inlet of a cooling channel forming the second flow path, among the plurality of cooling channels, is connected to the inlet, and the air outlet of the cooling channel forming the second flow path, among the plurality of cooling channels, is connected the outlet.

13. The outdoor display apparatus of claim 1, wherein the air inlet comprises an extension extending from an end portion of the plurality of the cooling channels.

14. The outdoor display apparatus of claim 1, further comprising:
the case is provided with an inlet and an outlet; and
a temperature sensor disposed in the inlet.

\* \* \* \* \*